United States Patent [19]
Yukawa et al.

[11] Patent Number: 5,621,822
[45] Date of Patent: Apr. 15, 1997

[54] METHOD OF DETECTING FOCUS POSITION OF OBJECT FROM VARIABLE GRAY LEVEL IMAGE OF OBJECT

[75] Inventors: Noriaki Yukawa, Nara-ken; Satoru Kimura, Sakai; Takeo Sato, Kawasaki, all of Japan

[73] Assignee: Matsushita Electric Industrial Co., Ltd., Osaka-fu, Japan

[21] Appl. No.: 282,430

[22] Filed: Jul. 29, 1994

[30] Foreign Application Priority Data

Jul. 30, 1993 [JP] Japan .................................. 5-189573

[51] Int. Cl.⁶ .................................................. G06K 9/40
[52] U.S. Cl. ................................................ 382/255; 348/348
[58] Field of Search .................................. 382/169, 237, 382/255, 106, 205; 348/348, 349; 358/227

[56] References Cited

U.S. PATENT DOCUMENTS

| | | | |
|---|---|---|---|
| 3,932,733 | 1/1976 | Olsen et al. | 318/640 |
| 4,855,943 | 8/1989 | Lewis | 365/575 |
| 4,969,198 | 11/1990 | Batchelder et al. | 382/205 |
| 4,994,920 | 2/1991 | Fujiwara et al. | 348/349 |
| 5,101,277 | 3/1992 | Kanata | 348/349 |
| 5,267,328 | 11/1993 | Gouge | 382/205 |
| 5,291,535 | 3/1994 | Baker et al. | 378/22 |
| 5,299,133 | 3/1994 | Kobsa et al. | 364/468 |

FOREIGN PATENT DOCUMENTS 62-272216  11/1987  Japan .

*Primary Examiner*—Joseph Mancuso
*Assistant Examiner*—Jayanti K. Patel
*Attorney, Agent, or Firm*—Wenderoth, Lind & Ponack

[57] ABSTRACT

A focus position detecting method includes: obtaining quantized two-dimensional image data including an object to be in focus with respect to an optical system by imaging the object through the optical system, defining a specified area in the two-dimensional image data; defining a partial image in the specified area, the partial image being composed of a target pixel and peripheral pixels on a line in a specified direction in which the target pixel exists; defining a left area and a right area respectively positioned on left and right sides of the target pixel on the line in the specified direction; calculating gray-level data of each pixel in the left area; calculating gray-level data of each pixel in the right area; obtaining as a gray-level ratio a ratio of calculation result of the left area to calculation result of the right area; calculating an evaluation function by means of the gray-level ratio by repeating the gray-level ratio calculating step in the specified area; obtaining a plurality of evaluation function calculation values in a variety of optical positions by repeating the steps for calculating the gray-level data of the left and right areas, obtaining the gray-level ratio, and calculating the evaluation function through variation of the optical position of the object, and obtaining a focus position of the object with respect to the optical system based on the evaluation function calculation values.

6 Claims, 9 Drawing Sheets

| −1 | 0 | 1 |

| 20 | 30 | 40 |

| 40 | 60 | 80 |

METHOD OF DETECTING FOCUS POSITION OF OBJECT FROM VARIABLE GRAY LEVEL IMAGE OF OBJECT

BACKGROUND OF THE INVENTION

The present invention relates to a focus position detecting method appropriate for an apparatus requiring focusing in picking up an image by means of an optical system lens in, for example, an aligner for semiconductor devices in which the optimum optical position of a positioning mark is made to be automatically adjusted in detecting the positions of a reticle and the aligner, and the positions of a wafer and the aligner.

In a conventional automatic focusing device or method, image data obtained by picking up an image is differentiated to form an evaluation function by utilizing the differentiated image data, and an optical position in which the evaluation function takes its extreme value among a variety of optical positions is determined to be the focus position. The evaluation function has been obtained in such forms as the maximum value of the absolute values of the differentiated image data, the sum of the absolute values of the differentiated image data being expressed by $$S1 = \sum_n Dn$$

or the sum of square values of the absolute values of the differentiated image data being expressed by $$S2 = \sum_n (Dn)^2$$

(where Dn is the absolute value of the differentiated image data, and n is an index corresponding to the addresses of all the pixels in a frame of an image or a window) (refer to Japanese Laid-Open Patent Publication No. 62-272216).

Describing in detail the above-mentioned method, gray-level data of pixels of an object image are firstly obtained from an output (video signal) of an image input device such as a video camera. As shown in FIG. 11, pixel gray-level data a, b, c, . . . corresponding to the pixels of the object image are obtained.

Then, as shown by a dotted rectangle in FIG. 11, a partial image 60 composed of 1×3 =3 pixels a, b, and c including a target pixel b is set up and then subjected to a differentiating process. The differentiating process is practically executed by a filtering process by means of a coefficient matrix composed of one column by three rows as shown in FIG. 13.

When the coefficient matrix as shown in FIG. 13 is used, there is derived a difference between the gray-level data a of the pixel positioned on the left side of the target pixel on a detection line and the gray-level data b of the pixel positioned on the right side of the target pixel on the detection line. The processing as shown in FIG. 13 can be expressed by the following expression.

Calculation result=[c]−[a]

When the processing of the partial image 60 is completed, the partial image is shifted sidewise by one pixel to set up a partial image 61 which excludes the pixel a and instead includes a pixel d positioned on the right side, and the same processing as described above is executed. When the processing is completed, the same processing is repetitively executed each time by shifting the partial image by one pixel to successively execute extraction processing.

Then, an evaluation function as described above is calculated by means of the thus obtained differentiated image data, and, after changing the optical position with respect to the object, the aforementioned processing is executed to calculate the evaluation function. The above-mentioned operation is executed by successively changing the optical position with respect to the object, and thus the position in which the evaluation function takes its extreme value is determined to be the focus position.

Unfortunately, the aforementioned conventional method of forming an evaluation function by means of differentiated image data has the following disadvantages.

It is assumed that pixel gray-level data A, B, C, . . . as shown in FIG. 12 are obtained as a result of the variation in quantity of light in spite of the fact that the object and the optical position with respect to the object are the same as in FIG. 11. When the gray-level data of the partial image 60 as shown in FIG. 11 and the gray-level data of a partial image 62 as shown in FIG. 12 are respectively as shown in FIGS. 14 and 15, there is a double contrast (gray-level difference) between the left area and the right area of the target pixel on the detection line in each case, and therefore the gray-level difference is visually quite conspicuous in the image.

In regard to the above, the calculation result is 20 in the case of the partial image 60 (FIG. 14), while the calculation result is 40 in the case of the partial image 62 (FIG. 15), meaning that the calculation results are different from each other doubly in magnitude to result in a great difference between the values of the evaluation functions. Although the above-mentioned example is an extreme case, the quantity of light for illuminating the object varies in picking up the image of the object by successively changing the optical position with respect to the object to detect the focus position. As a result, when the evaluation function has a varied value, the variation exerts great influence on the detection accuracy. Referring to the variation in gray-level caused by the variation in quantity of light as the "major gray-level variation", when the evaluation function is dependent on the major gray-level variation even in an identical optical position, the detection accuracy of the focus position is reduced to result in deteriorating the reproducibility.

As a countermeasure for the above, it can be also considered to automatically vary the evaluation function according to the degree of the variation in quantity of light. However, when a routine for surely sensing the variance in quantity of light and automatically varying the evaluation function is incorporated, a complicated processing algorithm is required to result in consuming much time in the extraction stage soon as to loose practicability.

SUMMARY OF THE INVENTION

An object of the present invention is to provide a focus position detecting method capable of obtaining with high accuracy the focus position of an object with respect to an optical system from a variable-gray-level image of the object without any complicated processing algorithm even when a major gray-level variation takes place.

In accomplishing the object, according to one aspect of the present invention, there is provided a focus position detecting method comprising steps of:

obtaining quantized two-dimensional image data including an object to be in focus with respect to an optical system by imaging the object through the optical system;

defining a specified area in the two-dimensional image data;

defining a partial image in the specified area, the partial image being composed of a target pixel and peripheral pixels on a line in a specified direction in which the target pixel exists;

defining a left area and a right area respectively positioned on left and right sides of the target pixel on the line in the specified direction;

calculating gray-level data of each pixel in the left area;

calculating gray-level data of each pixel in the right area;

obtaining as a gray-level ratio a ratio of calculation result of the left area to calculation result of the right area;

calculating an evaluation function by means of the gray-level ratio by repeating the gray-level ratio calculating step in the specified area;

obtaining a plurality of evaluation function calculation values in a variety of optical positions by repeating the steps for calculating the gray-level data of the left and right areas, obtaining the gray-level ratio, and calculating the evaluation function through variation of the optical position of the object; and obtaining a focus position of the object with respect to the optical system based on the evaluation function calculation values.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE PREFERRED EMBODIMENTS

Figure 1:
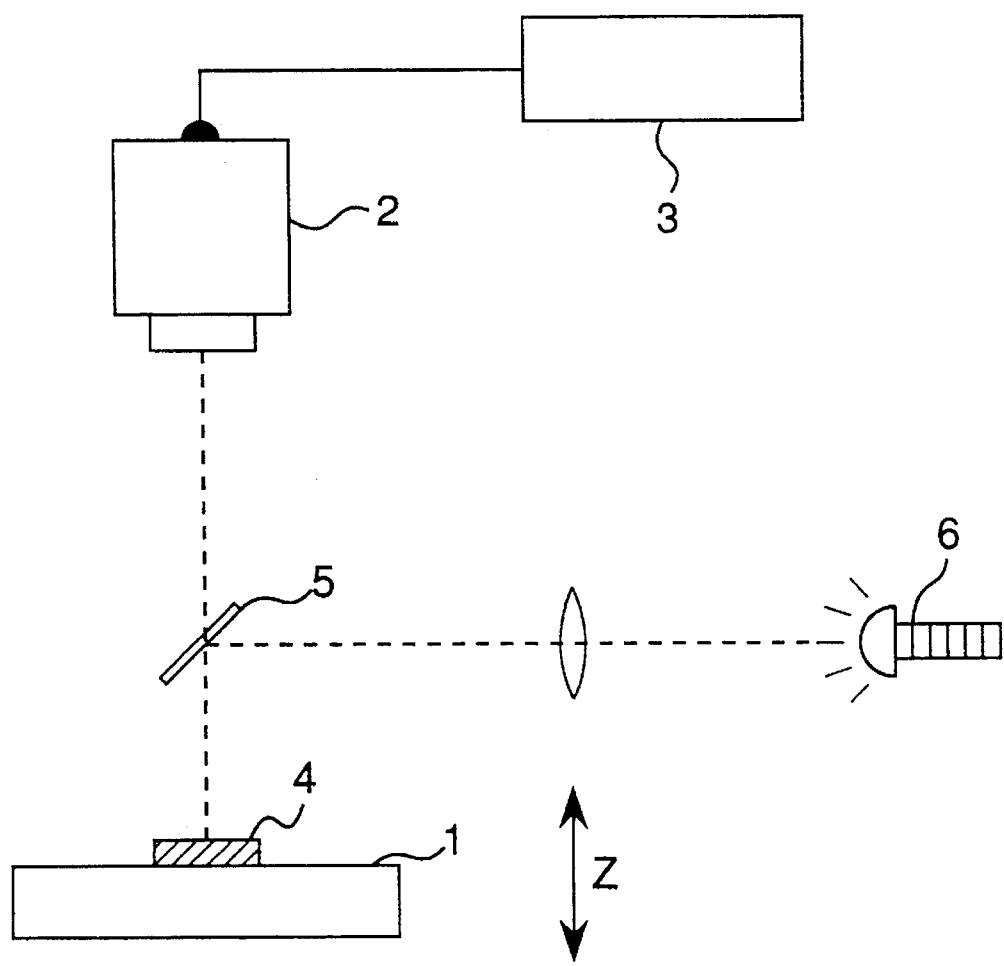
FIG. 1 is a schematic diagram of an apparatus for use in an embodiment of the focus position detecting method of the present invention.

Before the description of the present invention proceeds, it is to be noted that like parts are designated by like reference numerals throughout the accompanying drawings.

The following describes a focus position detecting method in accordance with an embodiment of the present invention with reference to the attached drawings. It should be noted that the present invention is of course not limited to the following embodiment.

Figure 2:
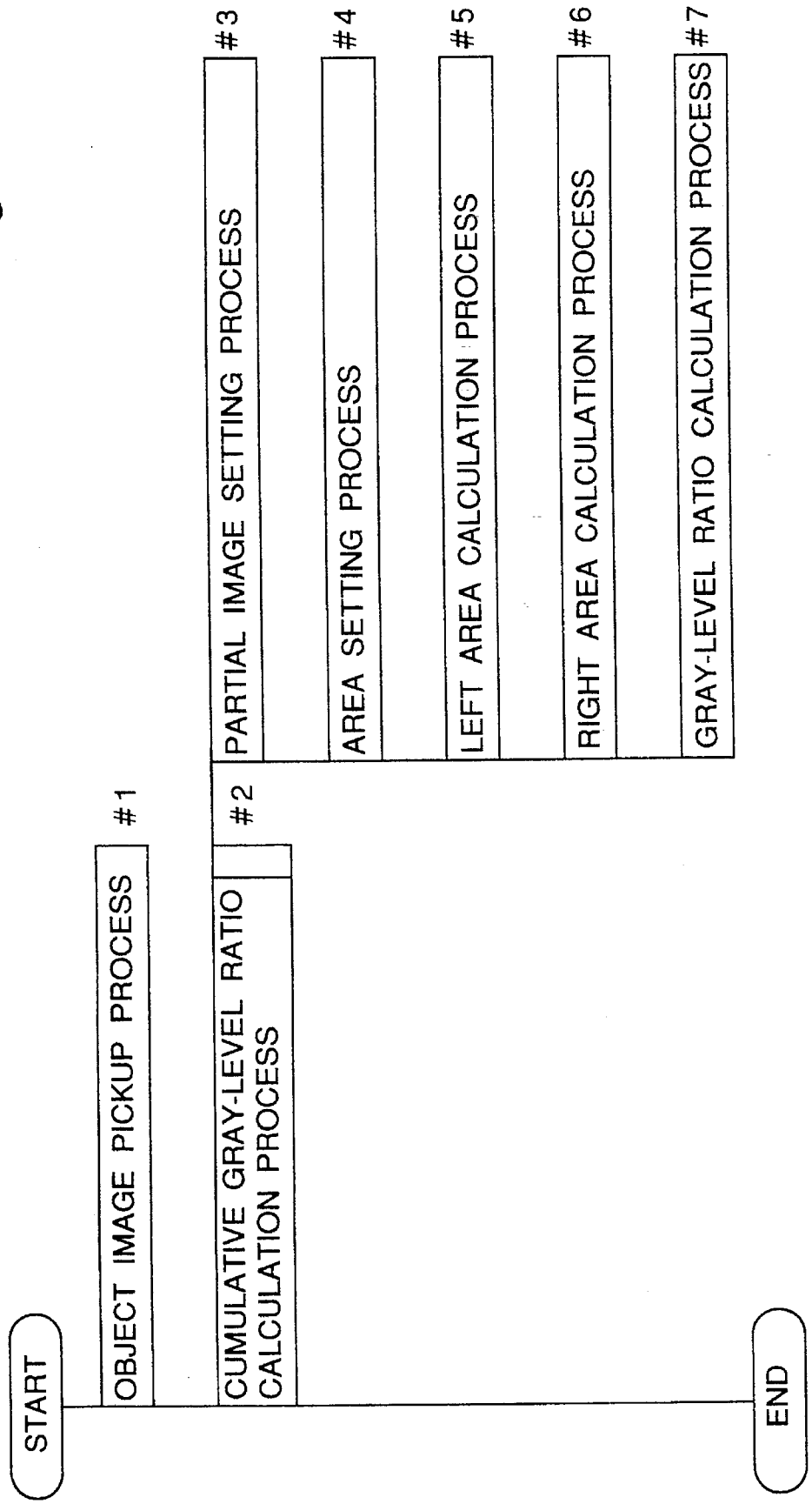
FIG. 2 is a flowchart of a main part of the operation of the embodiment.
Figure 3:
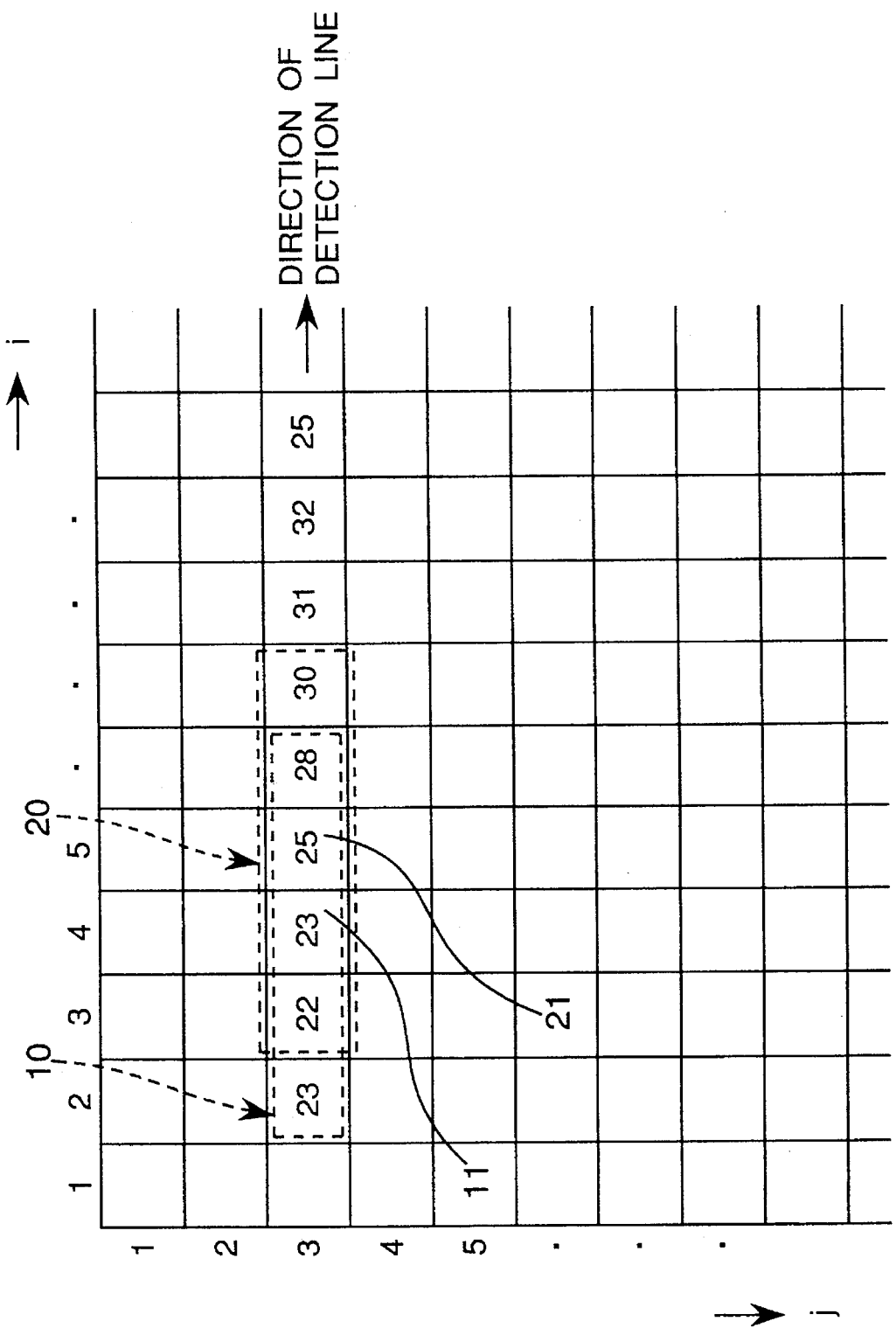
FIG. 3 is a schematic diagram of a partial image of the embodiment.

FIG. 1 shows the construction of an apparatus for implementing the focus position detecting method of the present embodiment. FIG. 2 is a flowchart of a main part of the focus position detecting operation. FIG. 3 is a diagram of a partial image.

Referring to FIG. 1, light emitted from an illumination device 6 is applied via a half-mirror 5 to a surface of an object 4 put on a stage 1 which is movable in a vertical z-direction, and the surface of the object 4 is picked up as an image by an image pickup device 2 via the half-mirror 5. The image pickup device 2 is provided with a CCD sensor to obtain a variable-gray-level signal of each pixel, and the signal is inputted to a calculation device 3 in a digitized form. In the calculation device 3, the signal is stored in a storage part in the form of, for example, 8-bit gray-level data in conformity to the rows and columns of pixels. In the calculation device 3, a program for executing the following processes is previously set up. In the present case, the stage 1 is moved while monitoring the focusing condition by means of the calculation device 3 to finally detect the z-direction position in which the best focus is achieved.

Then, the following describes the detection operation of the focus position. Referring to FIG. 2, in an object image pickup process in step #1, gray-level data representing the degree of gray-level of each pixel of the object image to be processed is produced.

Then, the program flow proceeds to step #2 of a cumulative gray-level ratio calculation process for the image data picked up. The process is composed of the following steps #3 through #7. In detail, a partial image setting process is first executed in step #3. In the present embodiment, a partial image 10 is composed of 1×5 (=5) pixels as shown by a dotted rectangular shape in FIG. 3. That is, the partial image 10 includes the gray-level data of 23, 22, 23, 25, and 28. Then, an area setting process is executed in step #4. There are set up two pixels in the left area (e.g. of the gray-level data of 23, 22 in FIG. 3) and two pixels in the right area (e.g. of the gray-level data of 25, 28 in FIG. 3) for a target pixel 11 of the gray-level data of 23 at the center of the partial image 10. Then, the program flow proceeds to steps #5, #6, and #7. According to FIG. 3, an average value AV1 (e.g. =(23+22)/2=22.5) of gray-level data belonging to the right area of the target pixel 11 and an average value AV2 (e.g. =(25+28)/2=26.5) of gray-level data belonging to the left area are obtained, and then the gray-level ratio of AV1 to AV2 is taken. By comparing the average values AV1 with AV2, the gray-level ratio is defined as follows.

When AV1>AV2: gray-level ratio=AV1/AV2
When AV1<AV2: gray-level ratio=AV2/AV1
When AV1=AV2: gray-level ratio=1.0

Since AV1=22.5<AV2=26.5 in the partial image 10, the gray-level ratio is AV2/AV1=26.5/22.5=1.18.

Figure 5:
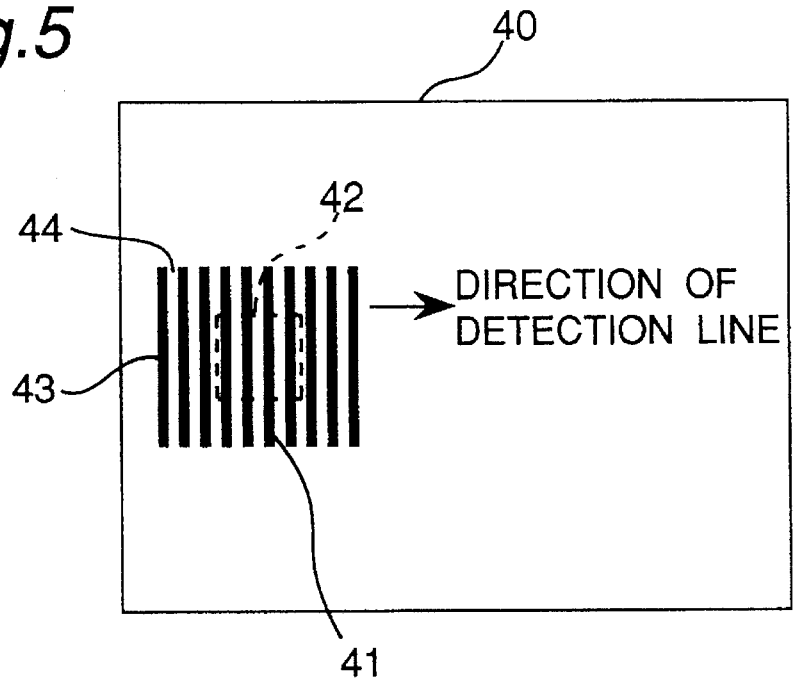
FIG. 5 is a schematic diagram of an object image of the embodiment.

In general, the difference in gray-level between a dark strip 43 and a bright strip 44 of a focus point detecting mark 41 provided in the image pickup device 2 and shown in FIG. 5 becomes large as the focusing is performed. The dark strip 43 and the bright strip 44 respectively have a small gray-level value and a large gray-level value when the positioning mark 41 is illuminated in the image pickup process. In this embodiment, the above definition for comparing the average values AV1 with AV2 is determined so that when the average values AV1 and AV2 are compared with each other, the difference between them becomes large to increase the gray-level ratio. That is, if the gray-level ratio is always found by an expression of AV1/AV2, the following disadvantages occur. That is, it is assumed that when the average value AV1 of the right area is 44 and the average value AV2 of the left area is 40, the gray-level ratio AV1/AV2 is 1.1. Also, when the average value AV1 of the right area is 40 and the average value AV2 of the left area is 44, the gray-level ratio AV1/AV2 is 0.9. In these cases, the cases have the same difference between the average values AV1 and AV2 of the right and left areas, but the gray-level ratios are different from each other. As a result, the sequential process, i.e. cumulative calculation process can not be correctly carried out.

Figure 4:
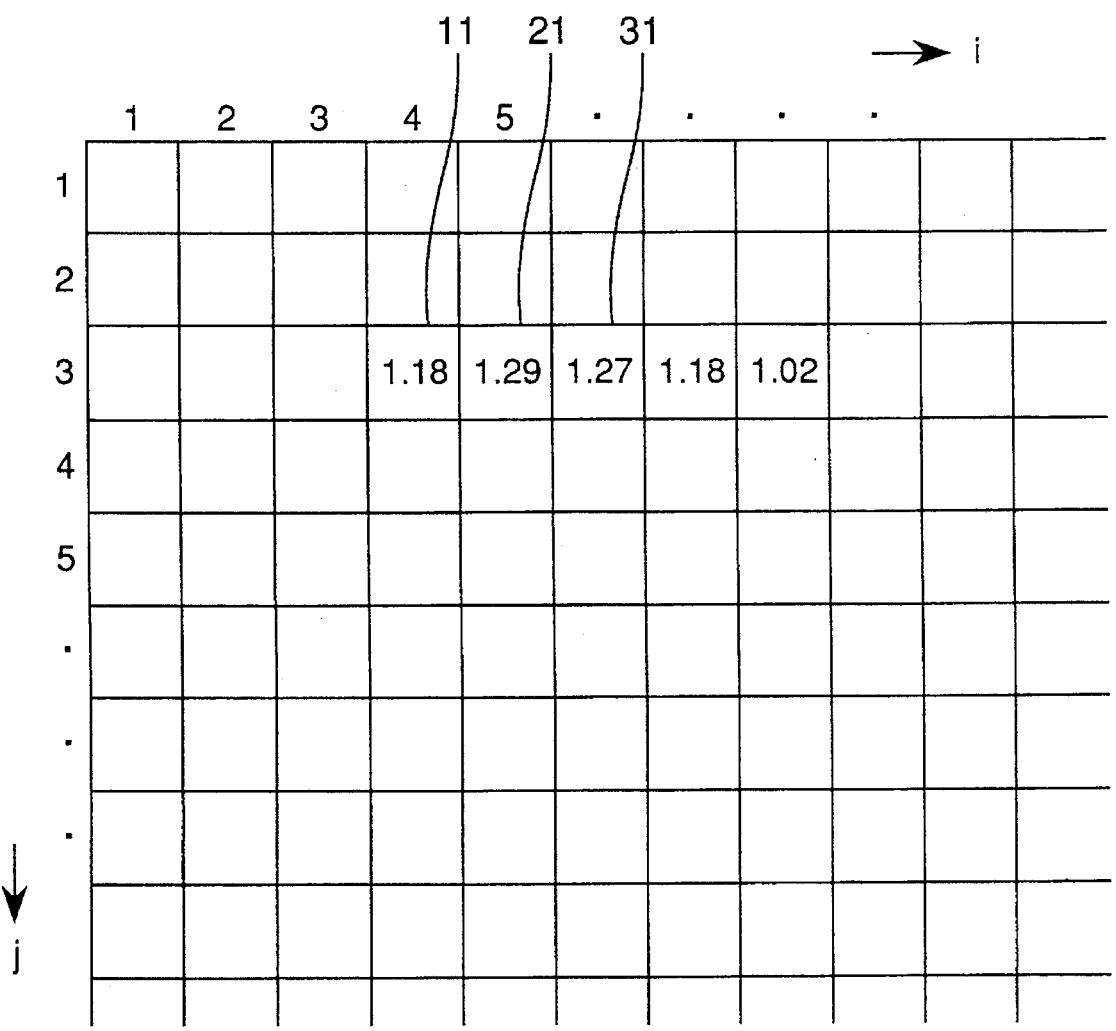
FIG. 4 is a schematic diagram of calculation results of target pixels of the embodiment.

After shifting the target pixels sidewise by one, the same operation as described above is executed. That is, for example, a next partial image 20 shown by another dotted rectangular shape in FIG. 3 includes the gray-level data of 22, 23, 25, 28, and 30. A target pixel 21 of the partial image 20 has gray-level data of 25, the left area thereof includes gray-level data of 22, 23, and the right area thereof includes gray-level of 28, 30. The same operation is repeated to obtain gray-level ratios. As shown in FIG. 4, the values of the gray-level ratios are 1.29, 1.27, 1.18, and 1.02 in order.

The above-mentioned processing is effected on a specified area 42 set up in a focus convergence point detecting mark 41 in an object image 40, and after a plurality of gray-level ratios are extracted in the area set up, a cumulative gray-level ratio is obtained.

Figure 6:
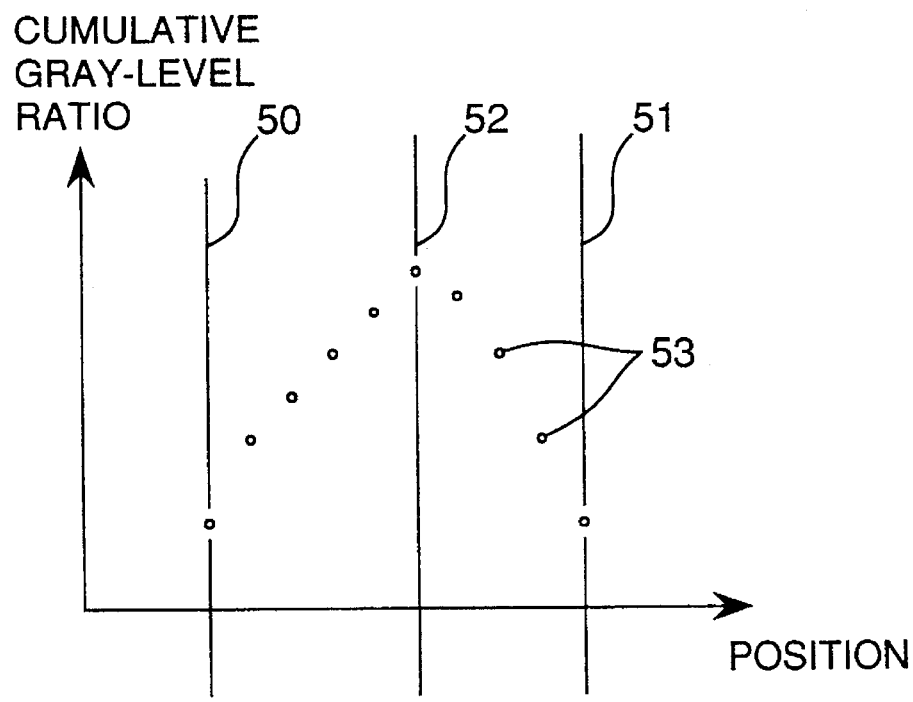
FIG. 6 is a graph showing a relationship between positions and cumulative gray-level ratio of the embodiment.

Subsequently, the processing as shown in FIG. 2 is executed while shifting the stage 1 shown in FIG. 1 each time by an appropriate quantity in a direction in which the focal point moves (z-direction), and a cumulative gray-level ratio in each position is obtained. FIG. 6 shows the z-direction in the abscissa axis and the cumulative gray-level ratio in the ordinate axis. In the present case, cumulative gray-level ratios 53 are obtained at ten points between a lower limit position 50 and an upper limit position 51. As a focus position, a position 52 having the greatest cumulative gray-level ratio is selected.

Figure 7:
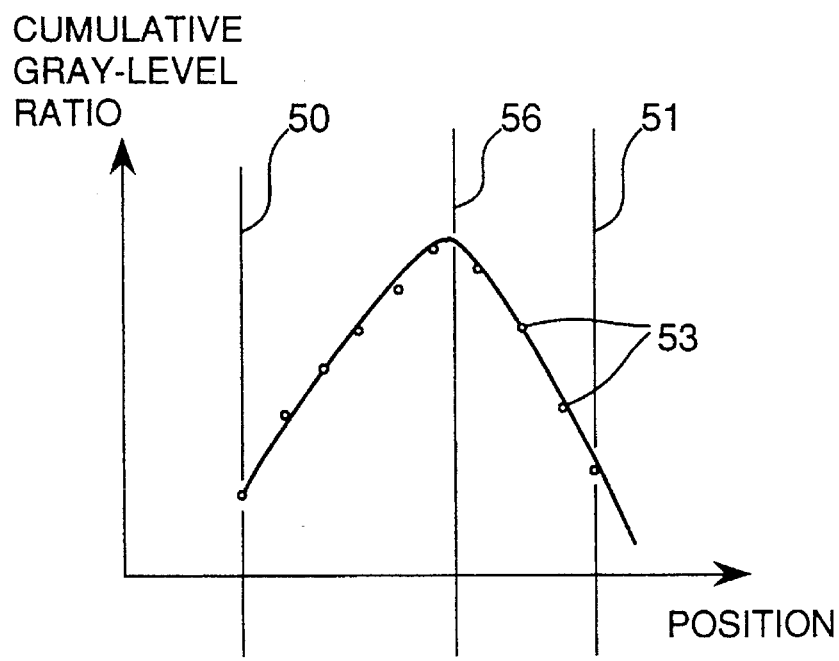
FIG. 7 is a graph showing an approximation curve of the embodiment.

It can be also considered to calculate an approximation curve 55 from the plural number of extracted positions and the cumulative gray-level ratios 53 in the positions and then determine the position 56 having the maximum value of the approximation curve 55 as the focus position, as shown in FIG. 7. In such a case, the detection position accuracy is remarkably increased.

Although the cumulative gray-level ratio is used as an evaluation function in the aforementioned embodiment, an arbitrary evaluation function, such as an evaluation function obtained by squaring each gray-level ratio and then accumulating the squared gray-level ratios can be adopted.

Although the partial image setting is executed by shifting the pixels one by one to achieve a very fine scanning in the aforementioned embodiment, an interlaced scanning of shifting the pixels every second (or every third) pixel in the partial image setting stage depending on the image to be processed can be adopted. When such an interlaced scanning is executed, a reduced processing time can be achieved.

Figure 8:
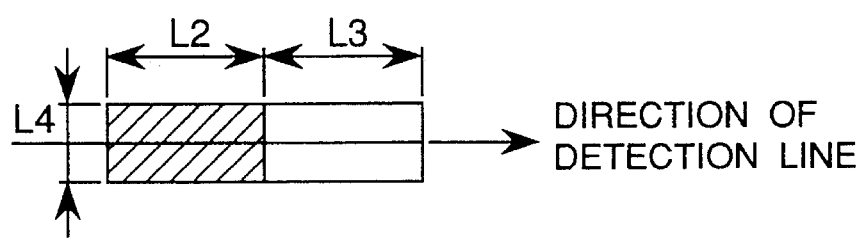
FIG. 8 is a schematic diagram of a partial image set up in the embodiment.

Although the left area L2, right area L3, and thickness L4 are set up in the direction of the detection line in setting a partial image in such a manner as shown in FIG. 8, there is no limitation on the sizes thereof. For example, the number of pixels at the right area can be designed to be different from the left area.

Figure 9:
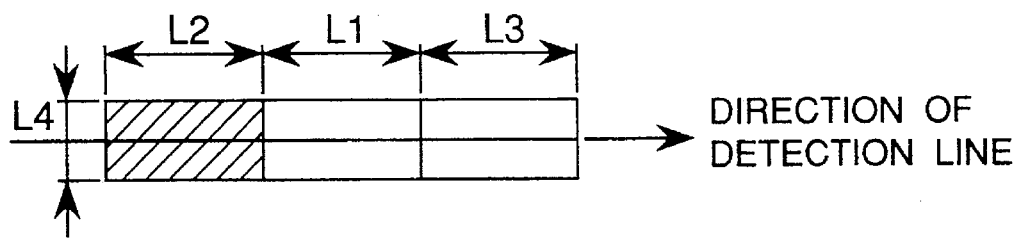
FIG. 9 is a schematic diagram of another partial image set up in the embodiment.

A dead zone L1 not to be processed can be set up in a manner as shown in FIG. 9. In such a case, a reduced processing time can be achieved.

As a partial image, there can be enumerated normally a rectangular one composed of a target pixel and pixels around the target pixel. However, the above-mentioned arrangement is not limitative, i.e., the size and the configuration of the partial image can be varied. For instance, the partial image area can be of a circular one. The target pixel is normally positioned at the center of the partial image. However, there can be a case where the position of the target pixel does not coincide with the center of the partial image as in the case where a partial image area of 2×6 pixels is set up. The present invention permits the eccentricity of the target pixel as described above.

As a calculating method for each area, there can be enumerated (1) calculation of an average value, (2) calculation of a mode value which is the value occurring most frequently in the obtained values, (3) calculation of the maximum value in the left area and calculation of the minimum value in the right area, (4) calculation of the minimum value in the left area and calculation of the maximum value in the right area, and (4) calculation of a sum when the number of pixels at the right area is the same as the left area, however, they are not limitative.

According to the method of obtaining an approximation curve from the plural number of extracted positions and cumulative gray-level ratios, there can be considered a variety of methods such as application of a parabola by multiple regression analysis and application of a spline function, however, the methods are not limitative.

Figure 10:
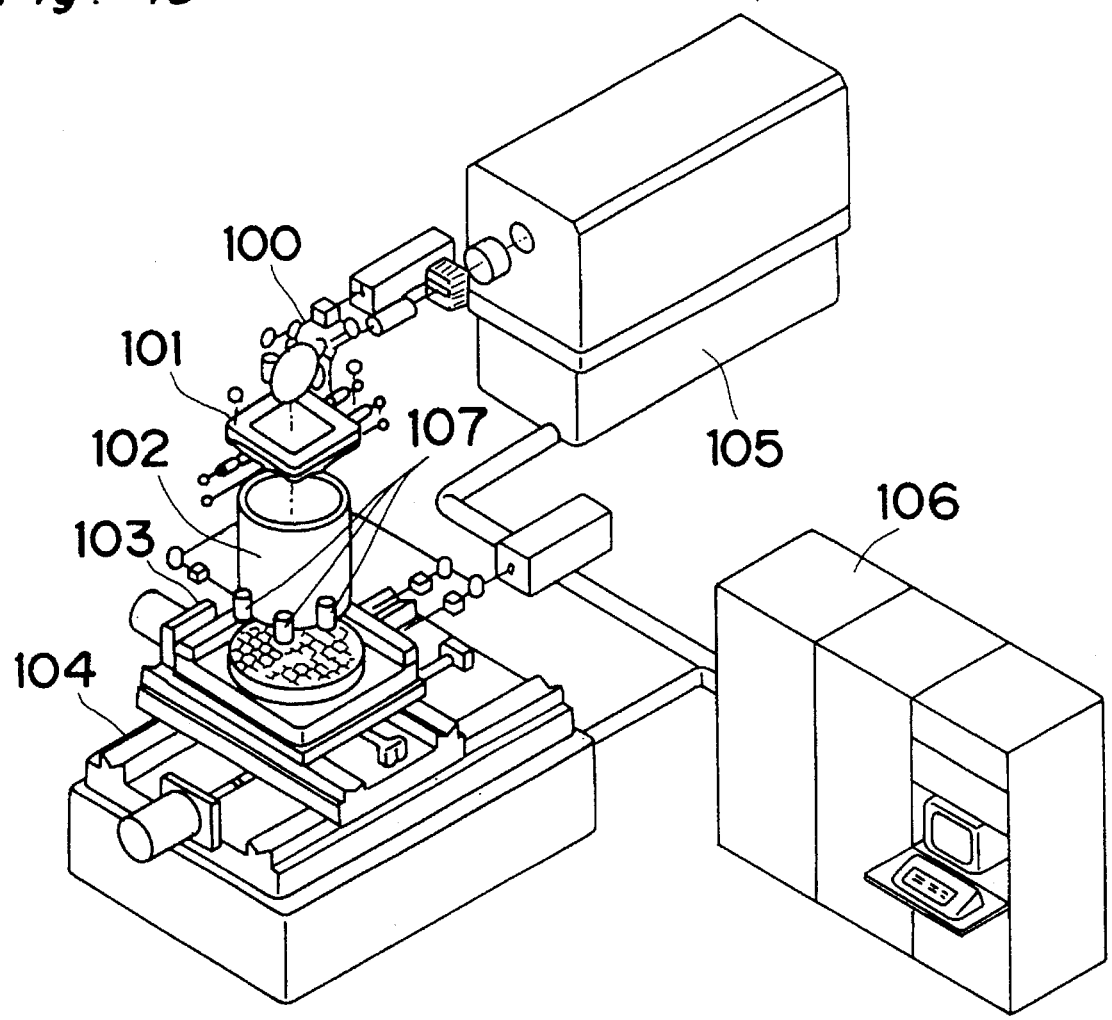
FIG. 10 is a perspective view of an aligner for semiconductor devices taken as an example of application of the present embodiment.
Figure 11:
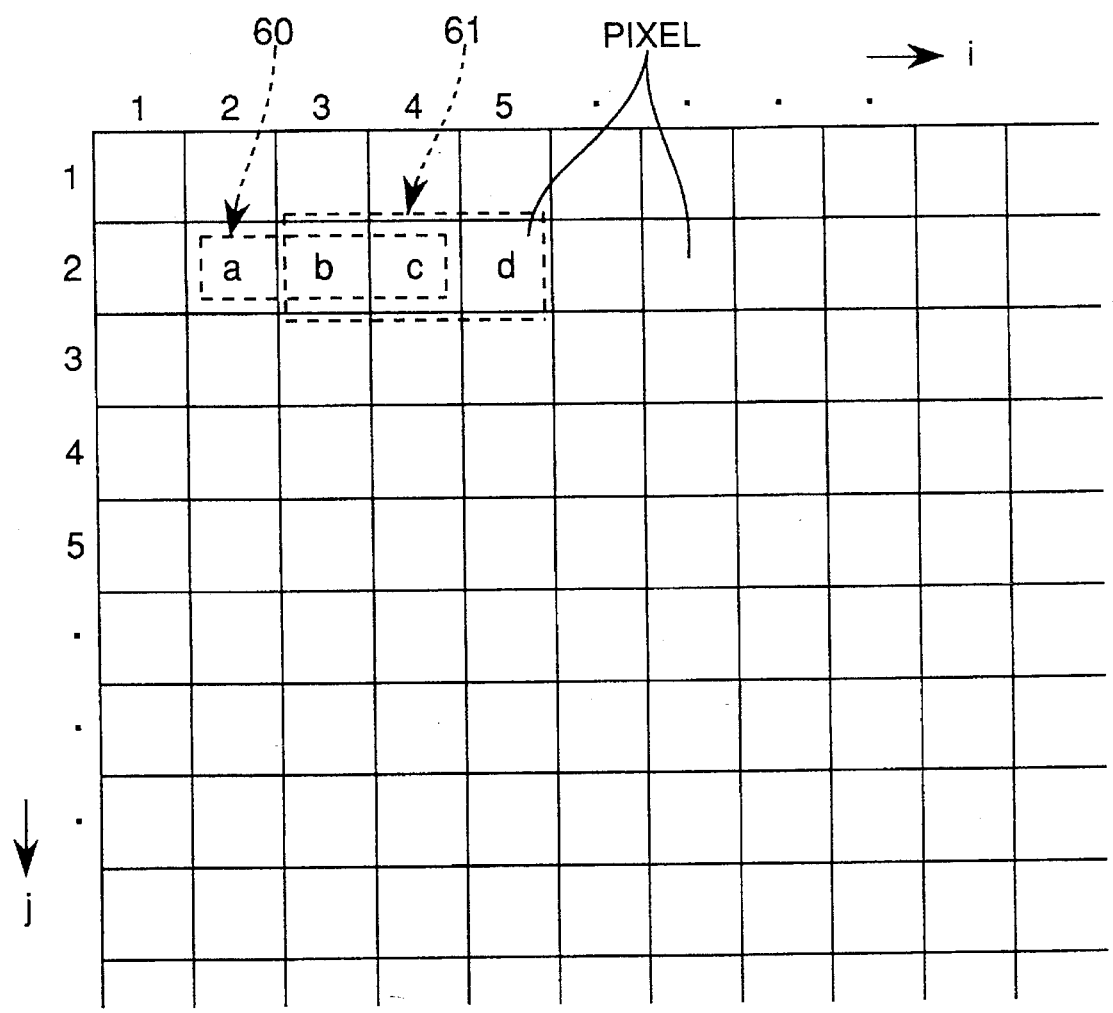
FIG. 11 is a diagram showing a partial image and gray-level data in a conventional example.
Figures 12, 13, 14, 15:
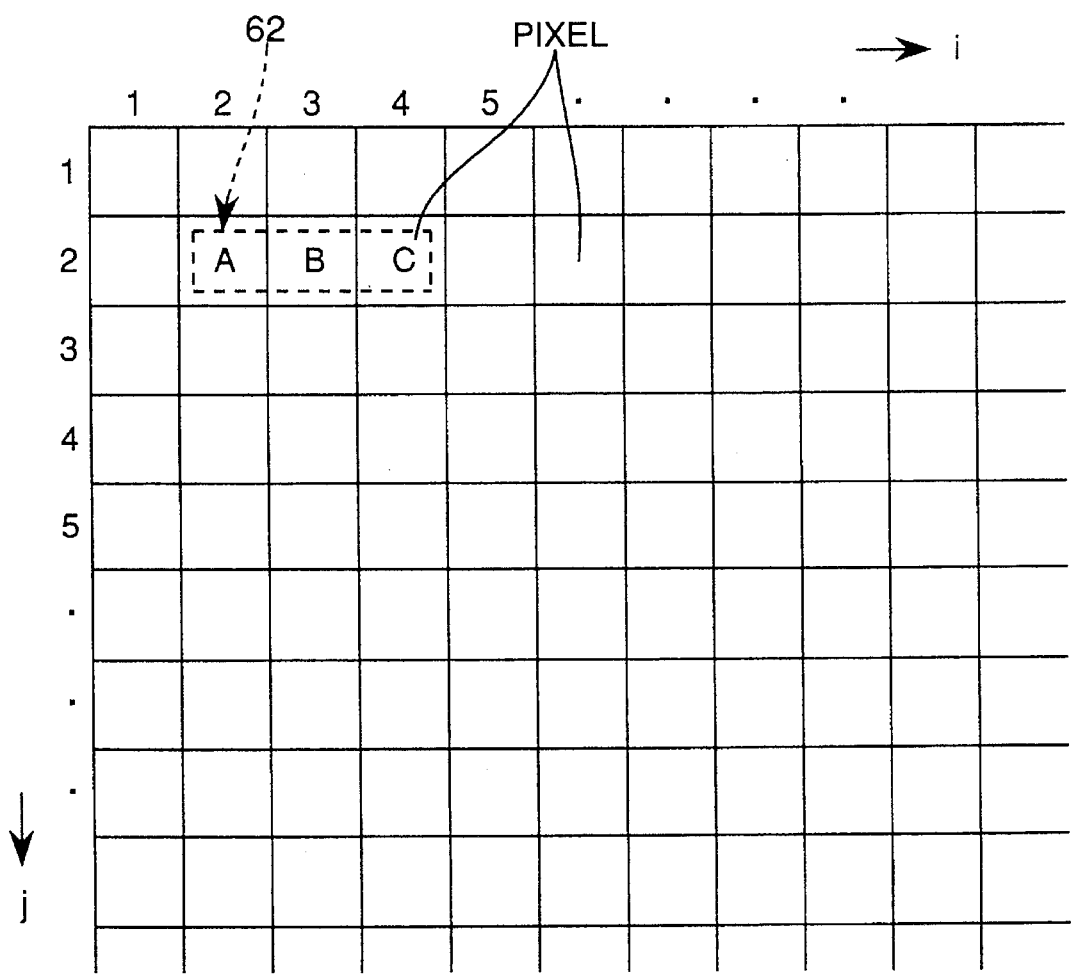
FIG. 12 is a diagram showing a partial image and varied gray-level data in a conventional example.
FIG. 13 is a diagram of a coefficient matrix for use in a conventional differentiating process.
FIG. 14 is a diagram for explaining gray-level data of a partial image in a conventional example.
FIG. 15 is a diagram for explaining gray-level data of a partial image when the quantity of light changes fin a conventional example.

Finally, FIG. 10 shows a perspective view of an aligner for semiconductor devices taken as an application example of the focus position detecting method of the present embodiment. Referring to FIG. 10, there are shown a reticle alignment optical system 100, a reticle (photomask) 101, a projection lens 102, a wafer 103, a wafer stage 104, a laser beam source 105, a control unit 106, and a wafer alignment optical system 107.

The construction relevant to the present invention includes an image processing device composed of the reticle alignment optical system 100, the camera, illumination device, and optical lens of the wafer alignment optical system 107, and the control circuit 106. The focus position detecting method of the present embodiment is applied to automatically adjusting the positioning mark to the optimum optical position in detecting the positions of the reticle 101 and the reticle alignment optical system 100, and the positions of the wafer stage 104 and the wafer alignment optical system 107. By utilizing the present embodiment, the focus position can be detected with an accuracy of 1/13 of the focus depth (an accuracy in position of 150 nm by an accuracy evaluation of 3 σ with respect to a focal depth of 2 μm) even in an environment where a change of ±20% in quantity of light of the illumination device exists). As compared with the embodiment, the focus position can be detected with an accuracy in position of 600 nm by an accuracy evaluation of 3 σ according to the conventional method previously described.

In the embodiment, when comparing the average values AV1 with AV2, the gray-level ratio can be defined as follows.

When AV1>AV2: gray-level ratio=AV2/AV1
When AV1<AV2: gray-level ratio=AV1/AV2
When AV1=AV2: gray-level ratio=1.0

At this time, as a focus position, a position having the smallest cumulative gray-level ratio is selected. That is, such a comparison can be found by calculating an absolute value of a difference between 1 and the ratio of the average values AV1 and AV2 based on the following expression:

$$\left| 1 - \frac{AV2}{AV1} \right|$$

According to the focus position detecting method of the present invention, a ratio of calculation results is taken from the gray-level data in the areas positioned on the left and right of the target pixel in a specified direction within a partial image. With the above-mentioned arrangement, the influence of the major gray-level variation in the image can be eliminated without any complicated algorithm. Furthermore, the gray-level data of the pixels arranged in a specified direction is incorporated in addition to the gray-level data of the target pixel, and therefore any spot-like image of which gray-level data has a great value exerts less influence to allow the extraction to be surely achieved. Therefore, the focus position can be surely extracted without varying the evaluation function in conformity to the degree of change in quantity of gray-level between a plurality of images having different major gray-level values nor requiring any complicated algorithm.

That is, according to the present invention, a ratio of calculation result values of gray-level data is taken, and therefore the influence of the major gray-level variation of the image can be eliminated. In other words, the influence of the major gray-level variation takes effect in a manner that all the gray-level data belonging to each partial image are multiplied by an identical coefficient ($\alpha$) no matter whether the partial image is dense or thin. It is assumed that, among the left and right areas on a specified directional line of a target pixel, the maximum gray-level data M of the gray-level data belonging to the right area is $\alpha m$, and the minimum gray-level data N of the gray-level data belonging to the left area is $\alpha n$. The gray-level data have a relationship in a ratio of M/N=$\alpha m/\alpha n$=m/n, which means that $\alpha$ relevant to the influence of the major gray-level variation exerts no influence. The same relationship exists in the case where an average value is adopted or the case where a mode value is adopted.

Therefore, even in an image having a major gray-level variation, the desired pixel can be surely extracted without being influenced by the major gray-level variation. Furthermore, merely the ratio is taken, and therefore the processing algorithm is not complicated. It should be noted that, in regard to the major gray-level variation, the same phenomenon of course takes place even when the object is changed.

Furthermore, the gray-level data of the pixels arranged in a specified direction are incorporated in addition to the gray-level data of the target pixel, and therefore any spot-like image of which gray-level data has a great value exerts less influence to allow the extraction to be surely achieved.

Furthermore, as an object image, there can be enumerated an image produced completely artificially other than an image obtained by picking up an image of a focus point detection mark on a surface of an industrial product such as a semiconductor wafer by means of a video camera or the like.

Although the present invention has been fully described in connection with the preferred embodiments thereof with reference to the accompanying drawings, it is to be noted that various changes and modifications will be apparent to those skilled in the art. Therefore, such changes and modifications are to be understood as being included within the scope of the present invention as defined by the appended claims, unless they depart from therefrom.

What is claimed is:

1. A focus position detecting method comprising steps of:

obtaining quantized two-dimensional image data including an object to be in focus with respect to an optical system by imaging the object through the optical system;

defining a specified area in the two-dimensional image data;

defining a partial image in the specified area, the partial image being composed of a target pixel and peripheral pixels on a line in a specified direction in which the target pixel exists;

defining a left area and a right area respectively positioned on left and right sides of the target pixel on the line in the specified direction;

calculating gray-level data of each pixel in the left area;

calculating gray-level data of each pixel in the right area;

obtaining as a gray-level ratio a ratio of calculation result of the left area to calculation result of the right area;

calculating an evaluation function by means of the gray-level ratio by repeating the gray-level ratio calculating step in the specified area;

obtaining a plurality of evaluation function calculation values in a variety of optical positions by repeating the steps for calculating the gray-level data of the left and right areas, obtaining the gray-level ratio, and calculating the evaluation function through variation of the optical position of the object; and obtaining a focus position of the object with respect to the optical system based on the evaluation function calculation values;

wherein after an average value AV1 of gray-level data of each pixel in the right area and an average value AV2 of gray-level data of each pixel in the left area are calculated, the gray-level ratio of the average value AV1 to the average value AV2 is calculated by the following condition:

when the average value AV1 of the right area is larger than the average value AV2 of the left area, the gray-level ratio is AV1/AV2;

when the average value AV1 of the right area is smaller than the average value AV2 of the left area, the gray-level ratio is AV2/AV1; and when the average value AV1 of the right area is the same as the average value AV2 of the left area, the gray-level ratio is 1.0.

2. The focus position detecting method as claimed in claim 1, wherein a position having the greatest cumulative gray-level ratio is selected as the focus position.

3. The focus position detecting method as claimed in claim 1, wherein interpolation data are obtained for the plural number of evaluation function calculation values in a plurality of optical positions, and the focus position of the object with respect to the optical system is obtained based on a result including the interpolation data.

4. A focus position detecting method comprising steps of:

obtaining quantized two-dimensional image data including an object to be in focus with respect to an optical system by imaging the object through the optical system;

defining a specified area in the two-dimensional image data;

defining a partial image in the specified area, the partial image being composed of a target pixel and peripheral pixels on a line in a specified direction in which the target pixel exists;

defining a left area and a right area respectively positioned on left and right sides of the target pixel on the line in the specified direction;

calculating gray-level data of each pixel in the left area;

calculating gray-level data of each pixel in the right area;

obtaining as a gray-level ratio a ratio of calculation result of the left area to calculation result of the right area;

calculating an evaluation function by means of the gray-level ratio by repeating the gray-level ratio calculating step in the specified area;

obtaining a plurality of evaluation function calculation values in a variety of optical positions by repeating the steps for calculating the gray-level data of the left and right areas, obtaining the gray-level ratio, and calculating the evaluation function through variation of the optical position of the object; and obtaining a focus position of the object with respect to the optical system based on the evaluation function calculation values;

wherein after an average value AV1 of gray-level data of each pixel in the right area and an average value AV2 of gray-level data of each pixel in the left area are calculated, the gray-level ratio of the average value AV1 to the average value AV2 is calculated by the following condition:

when the average value AV1 of the right area is larger than the average value AV2 of the left area, the gray-level ratio is AV2/AV1;

when the average value AV1 of the right area is smaller than the average value AV2 of the left area, the gray-level ratio is AV1/AV2; and when the average value AV1 of the right area is the same as the average value AV2 of the left area, the gray-level ratio is 1.0.

5. The focus position detecting method as claimed in claim 4, wherein a position having the smallest cumulative gray-level ratio is selected as the focus position.

6. The focus position detecting method as claimed in claim 4, wherein interpolation data are obtained for the plural number of evaluation function calculation values in a plurality of optical positions, and the focus position of the object with respect to the optical system is obtained based on a result including the interpolation data.

* * * * *